US012787837B2

(12) United States Patent
Lee et al.

(10) Patent No.: US 12,787,837 B2
(45) Date of Patent: Nov. 3, 2026

(54) DIPPING APPARATUS, DIE BONDING APPARATUS, AND MANUFACTURING METHOD FOR SEMICONDUCTOR DEVICE

(71) Applicant: Fasford Technology Co., Ltd., Yamanashi (JP)

(72) Inventors: Geonju Lee, Minami-Alps (JP); Kazunobu Sakai, Minami-Alps (JP); Takahiro Kato, Minami-Alps (JP)

(73) Assignee: FASFORD TECHNOLOGY CO., LTD., Minami-Alps (JP)

( * ) Notice: Subject to any disclaimer, the term of this patent is extended or adjusted under 35 U.S.C. 154(b) by 1053 days.

(21) Appl. No.: 17/944,248

(22) Filed: Sep. 14, 2022

(65) Prior Publication Data

US 2023/0090693 A1 Mar. 23, 2023

(30) Foreign Application Priority Data

Sep. 22, 2021 (JP) ................................ 2021-153695

(51) Int. Cl.
*H10W 72/00* (2026.01)
*H10W 90/00* (2026.01)

(52) U.S. Cl.
CPC ...... *H10W 72/0112* (2026.01); *H10W 72/012* (2026.01); *H10W 72/01215* (2026.01); *H10W 72/01271* (2026.01); *H10W 72/07118* (2026.01); *H10W 72/07131* (2026.01); *H10W 72/07183* (2026.01); *H10W 72/072* (2026.01); *H10W 90/721* (2026.01)

(58) Field of Classification Search
CPC ....... H01L 24/742; H01L 24/11; B23K 1/203; B23K 1/0016; B23K 3/0623; B23K 3/082
See application file for complete search history.

(56) References Cited

U.S. PATENT DOCUMENTS

| | | | | |
|---|---|---|---|---|
| 2015/0345930 A1* | 12/2015 | Ikeda | ................. | G01B 11/0616 356/630 |
| 2020/0095685 A1* | 3/2020 | Han | ........................ | C23C 18/42 |
| 2023/0307595 A1* | 9/2023 | Tamaki | ................ | H10H 20/856 |

FOREIGN PATENT DOCUMENTS

| | | | | | |
|---|---|---|---|---|---|
| CN | 202701351 U | | 1/2013 | | |
| JP | 3591344 B2 | * | 11/2004 | | |
| JP | 2011108948 A | * | 6/2011 | .......... | H10W 72/012 |
| JP | 2015177038 A | * | 10/2015 | | |

OTHER PUBLICATIONS

English Translation for Foreign Reference Yoshihide (Year: 2015).*
English Translation of Takatoshi (Year: 2004).*
English translation of Hideaki (Year: 2011).*
Chinese Office Action received in corresponding Chinese Application No. 2022110830490.9 dated Jan. 22, 2026.

* cited by examiner

*Primary Examiner* — Wael M Fahmy
*Assistant Examiner* — Thomas Wilson Mccoy
(74) *Attorney, Agent, or Firm* — MATTINGLY & MALUR, PC

(57) ABSTRACT

A dipping apparatus includes a squeegee device and a plate for forming a flux film out of flux. A surface of the plate has a rough surface with a nano-level arithmetically average roughness. The dipping apparatus is configured in such a way that the squeegee device and the plate are moved relatively to each other, and the flux is fed from the squeegee device to the rough surface of the plate.

3 Claims, 12 Drawing Sheets

DIPPING APPARATUS, DIE BONDING APPARATUS, AND MANUFACTURING METHOD FOR SEMICONDUCTOR DEVICE

CLAIM OF PRIORITY

The present application claims priority from Japanese patent application JP2021-153695 filed on Sep. 22, 2021, the content of which is hereby incorporated by reference into this application.

BACKGROUND

The present disclosure relates to die bonding apparatuses and, for example, the present disclosure can be applied to a die bonder used for flux transfer.

The die bonding apparatus mounts semiconductor chip called die on, for example, the front surface of wiring board, lead frame, or the like (hereinafter referred to as a substrate). In plural types of the die bonding apparatuses there is an apparatus (a flip-chip bonder) that picks up die, which is separated from a wafer, turns the die upside down, and then bonds the die with its front surface set downward onto a substrate. In some types of flip-chip bonders, there is a dipping step in which flux is applied to bumps which are protruding connection electrodes installed on the front surface of die. In this case, the flux is a soldering acceleration agent, and has a cleaning action to remove foreign matters and oxide films, an antioxidant action to prevent oxidation of joint portions, and a surface tension reduction action to prevent melted solders from being rounded.

In the dipping step, a bond head moves up and down, immerses the bump surfaces of a die in a concave cavity that is installed in a flux-applying device and contains flux film, and transfers the flux film to the bumps. In addition, the flux-applying device has a mechanism used for replenishing the flux film consumed by the transfer in the cavity. This mechanism executes this replenishment work by moving a container, which contains flux and the bottom of which is opened, on a plate with the cavity. Such a flux-applying device is disclosed by Japanese Patent Application Publication No. 2015-177038.

SUMMARY

Generally speaking, the thickness of a flux film to be transferred to bumps is about one third of the diameter of a bump as a guide. For example, in the case of C4 (Controlled Collapse Chip Connection) bump with a diameter of ϕ75 to 150 μm, the thickness of a flux film is 30 to 100 μm, and in the case of C2 (Chip Connection) bump with a diameter of ϕ55 to 100 μm, the thickness of a flux film is 10 to 30 μm. Therefore, if as a bump pitch becomes narrower, the diameter of the bump becomes smaller accordingly, so that it becomes necessary to reduce the thickness of the relevant flux film. At the time of forming a flux film with a thin thickness out of flux, it becomes difficult to form a flux film with a uniformly thin thickness because the flux cannot be uniformly spread on the plate and the thickness of the flux film becomes ununiformed.

An object of the present disclosure is to provide a technology that enables a more uniform thin flux film to be formed.

The general outline of one typical aspect of the present disclosure can be explained briefly as follows. That is to say, a dipping apparatus includes a squeegee device and a plate that forms a flux film out of flux. A surface of the plate has a rough surface with a nano-level arithmetically average roughness. The dipping apparatus is configured in such a way that the squeegee device and the plate are moved relatively to each other, and the flux is fed to the rough surface of the plate from the squeegee device.

According to the present disclosure, a more uniform thin flux film can be formed.

DESCRIPTION OF THE PREFERRED EMBODIMENTS

Hereinafter, an embodiment will be explained with reference to the accompanying drawings. However, in the following explanations, the same components are given the same reference signs, and repetitive explanations about the same components will be omitted in some cases. Furthermore, there are some cases where, in order to make the explanations clearer in the accompanying drawings, the widths, thicknesses, shapes, and the like of the portions of the present aspect are schematically depicted differently from what those of the portions of the present aspect really are, but these depictions are only examples, so that the interpretation of the present disclosure is not limited to these depictions.

A flip-chip bonder as a die bonding apparatus will be explained. Here, the flip-chip bonder according to the present embodiment is used for manufacturing, for example, a fan out panel level package (FOPLP), which is a package forming a rewiring layer in a broad region exceeding the area of a chip included in the package, and the like.

Configuration of a Flip-Chip Bonder

Figure 1:
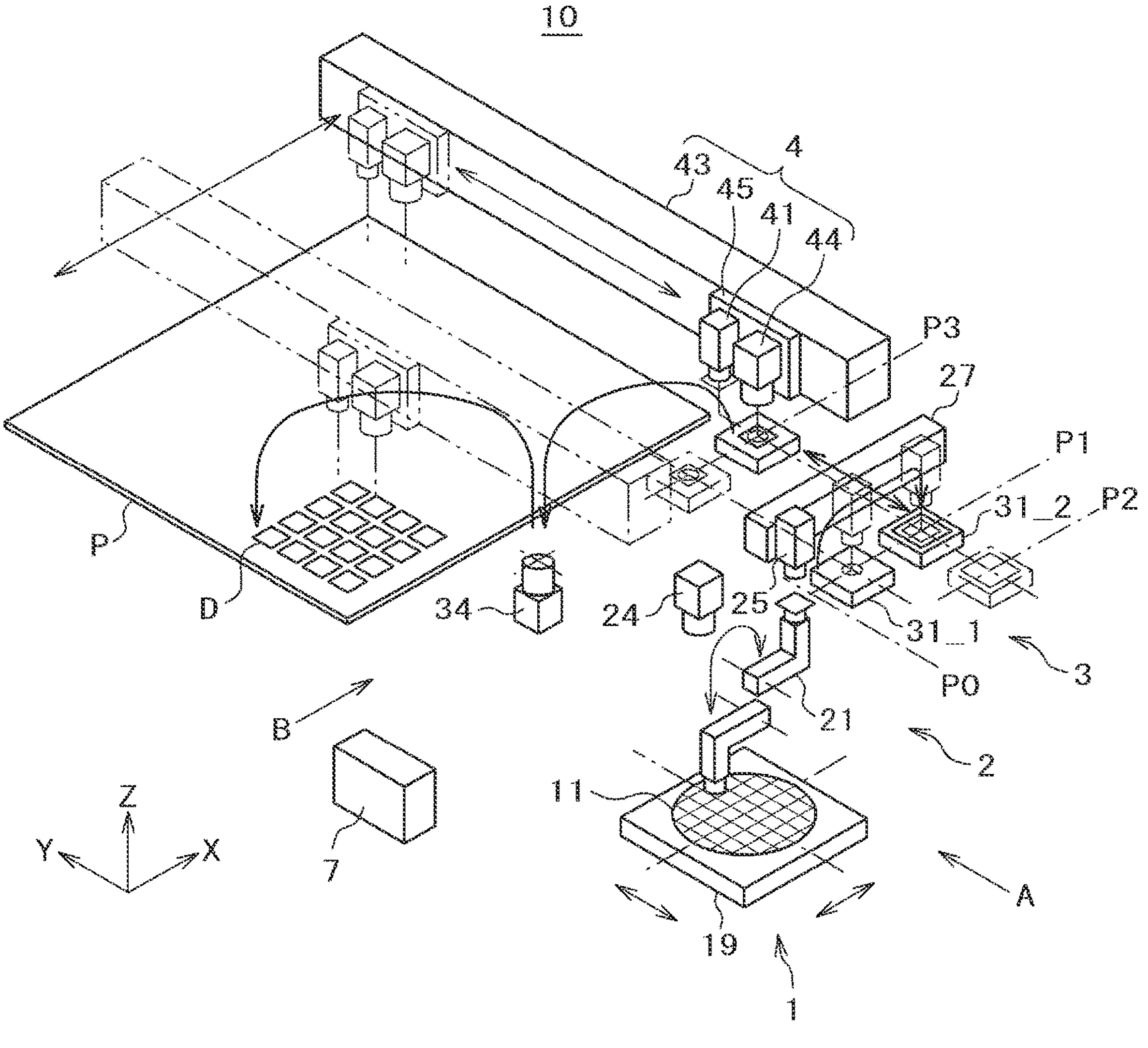
FIG. 1 is a perspective view showing the general overview of a flip-chip bonder according to an embodiment.
Figure 2:
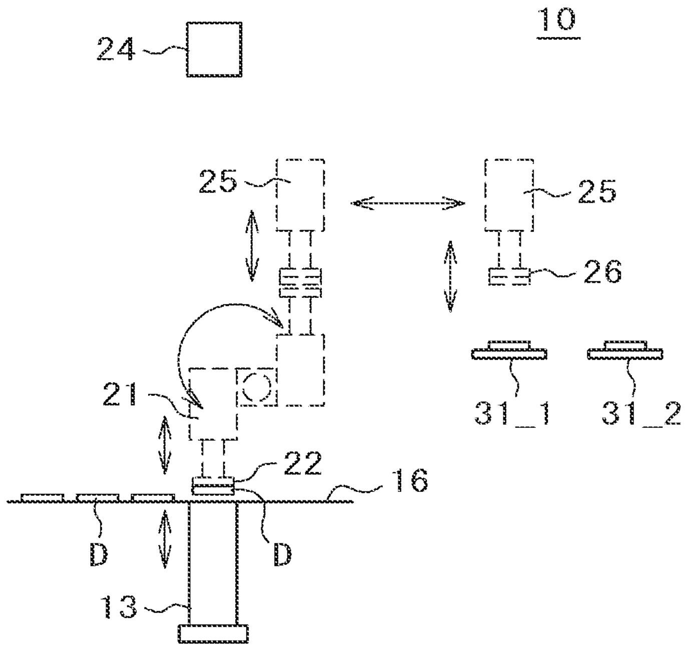
FIG. 2 is a diagram for illustrating the movements of a pickup flip head and a transfer head when viewed from the direction of an arrow A in FIG. 1.
Figure 3:
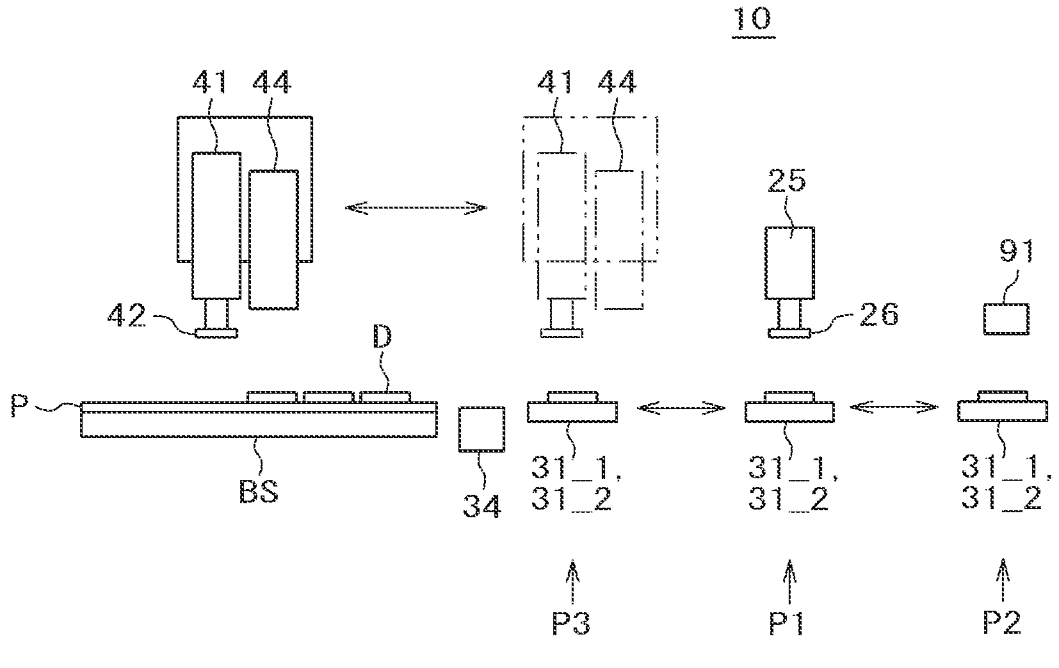
FIG. 3 is a diagram for illustrating the movements of an intermediate stage and a bond head when viewed from the direction of an arrow B in FIG. 1.
Figure 4:
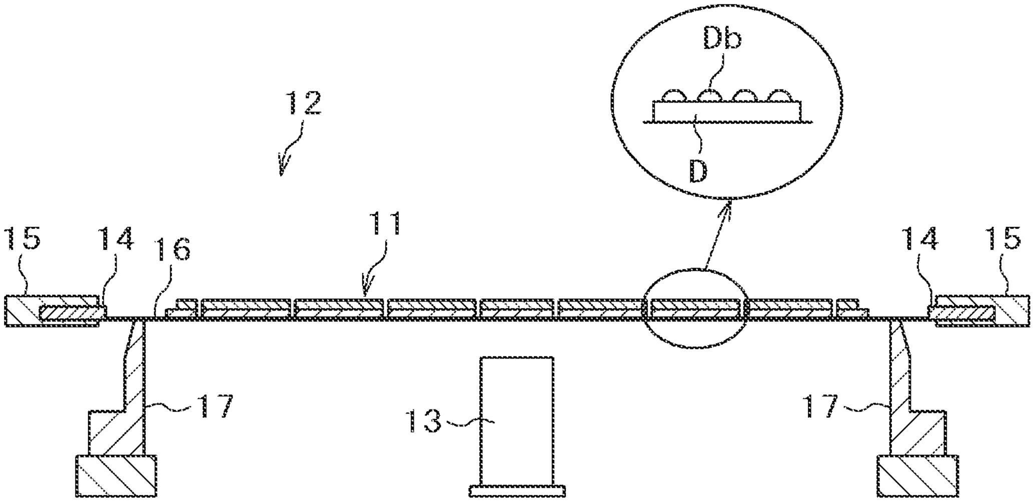
FIG. 4 is a schematic cross-sectional view of the main portion of a die feed unit shown in FIG. 1.

FIG. 1 is a perspective view showing a schematic configuration of a flip chip bonder according to the present embodiment. FIG. 2 is a diagram for illustrating the movements of a pickup flip head and a transfer head when viewed from the direction of an arrow A in FIG. 1. FIG. 3 is a diagram for illustrating the movements of an intermediate stage and a bond head when viewed from the direction of an arrow B in FIG. 1. FIG. 4 is a schematic cross-sectional view of the main portion of a die feed unit shown in FIG. 1.

As shown in FIG. 1, roughly speaking, a flip-chip bonder 10 includes a die feed unit 1, a pickup unit 2, an intermediate stage 3, a bonding unit 4, and a control device 7 that monitors and controls the operation of each unit. The flip-chip bonder 10 performs face-down bonding in which a die D is mounted on a substrate P with its front surface (bump surface) face-down.

Die Feed Unit

The die feed unit 1 feeds a die D to be mounted on a substrate P that is an example of a piece of work. As shown in FIG. 4, the die feed unit 1 includes a wafer holding pedestal 12 for holding a divided wafer 11, and a push-up unit 13 for pushing up a die D from the wafer 11. The wafer holding pedestal 12 is moved in the X or Y direction by a wafer holding pedestal table 19 as a drive mechanism shown in FIG. 1, and a die D to be picked up is moved onto the position of the push-up unit 13. A wafer cassette (not shown) in which a wafer ring 14 is housed is provided from the outside of the flip chip bonder 10. The wafer ring 14 is a jig using which the wafer 11 is fixed and can be attached to the wafer holding pedestal 12.

As shown in FIG. 4, the wafer holding table 12 includes: an expand ring 15 for holding the wafer ring 14; a support ring 17 that determine horizontally the positions a dicing tape 16, held by the wafer ring 14 and to which a plural of dice D are adhered; and the push-up unit 13 for pushing up a die D upward. In order to pick up a predefined die D, the push-up unit 13 is configured to be moved in an upward or a downward direction by an unshown drive mechanism.

On the dicing tape 16, the front surface of die D face upward, and, for example, bumps Db are provided on the front surface of the die D on which face-down bonding is to be performed as shown in FIG. 4. Here, plural bumps Db, which are, for example, in a convex shape, are provided discretely on the front surface of a die D.

Pickup Unit

The pickup unit 2 includes: a pickup flip head 21 that picks up a die D and reverses the die D; a wafer recognition camera 24; a transfer head 25; and a drive unit 27 that moves the transfer head 25 up, down, and along the X axis direction.

The pickup flip head 21 is moved up and down, rotated, and moved along the X axis direction by an unshown drive unit. The pickup flip head 21 rotates in the XZ plane around a rotation axis along the Y axis direction to reverse a picked-up die D. As shown in FIG. 2, the pickup flip head 21 has a collet 22 that adsorbs the die D and holds the die D at its tip, and the transfer head 25 has a collet 26 that adsorbs the die D and holds the die D at its tip. The wafer recognition camera 24 is installed just above a die D to be picked up. With such a configuration, the pickup flip head 21 picks up a die D on the basis of photographed data taken by the wafer recognition camera 24, and the die D is reversed by rotating the pickup flip head 21 by 180 degrees, so that the back surface of the die D is turned up, and the die D is set to be in the posture of being handed over to the transfer head 25.

The transfer head 25 is configured in such a way that, after receiving the reversed die D from the pickup flip head 21, the transfer head 25 is moved along the X axis direction by the drive unit 27 and mounts the die D on the intermediate stage unit 3.

Intermediate Stage Unit

The intermediate stage 3 includes a first intermediate stage 31_1 and a second intermediate stage 31_2 on which a die D is temporarily mounted, and an under vision camera 34. The first intermediate stage 31_1 and the second intermediate stage 31_2 can be moved in the Y axis direction by an unshown drive unit. In addition, the second intermediate stage 31_2 includes a dipping mechanism to be described later.

As shown in FIG. 3, the first intermediate stage 31_1 and the second intermediate stage 31_2 can be moved to a first position P1, a second position P2, or a third position P3 in the Y axis direction. Here, the first position P1 is a position where a die D is handed over to the transfer head 25. The second position P2 is a flux film forming position described later on the second intermediate stage 31_2. The third position P3 is a position where a die D is handed over to a bond head 41. The under vision camera 34 photographs the lower surface of the die D held by the bond head 41.

Bonding Unit

The bonding unit 4 includes the bond head 41, a bond head table 45, a gantry table (Y beam) 43, a pair of X beams (not shown) that moves the gantry table 43 in the X axis direction, and a bond camera 44. As shown in FIG. 3, the bond head 41 has a collet 42 that adsorbs a die D and holds the did D at its tip. The bond head 41 picks up a die D from the first intermediate stage 31_1 or the second intermediate stage 31_2, and bonds the die D onto a carried-in substrate P. When the die D is bonded onto the substrate P, the substrate P is in a state of being adsorbed and fixed to a bond stage BS. The bond head table 45 moves the bond head 41 along the Z axis direction. The gantry table 43 is extending to the Y axis direction so as to stride over the bond stage BS, and each of both ends of the gantry table 43 is supported by the relevant beam of the pair of X beams so that the gantry table 43 can freely moves along the X axis direction. The gantry table 43 moves the bond head table 45 along the Y axis direction. The bond camera 44 is mounted on the bond head table 45. The bond camera 44 photographs a position recognition mark (not shown) of the substrate P and recognizes a bonding position.

With such a configuration, the bond head 41 picks up a die D from the first intermediate stage 31_1 or the second intermediate stage 31_2, and the under vision camera 34 and the bond camera 44 photograph a state of the die D being held by the bond head 41 and a position to which the die D is bonded respectively. On the basis of these photographed data, a bonding positioning correction position is calculated on the basis of these photographed data, and the bond head 41 is moved to bond the die D to the substrate P.

The flip chip bonder 10 includes a pair of parallel carrying rails that moves a substrate P along the X axis direction, a substrate feed unit that feeds a substrate P carried in from the outside of the flip chip bonder 10 to the pair of parallel carrying rails, and a substrate carrying-out unit that carries out a substrate P on which dice D are mounted to the outside of the flip chip bonder 10, where the pair of parallel carrying rails, the substrate feed unit, and the substrate carrying-out unit are not shown. With a such configuration, a substrate P is fed from the substrate feed unit, the substrate is moved along the pair of parallel carrying rails to the relevant bonding position and, after the dice D are bonded, the substrate P is moved to the substrate carrying-out unit and handed over to the substrate carrying-out unit. While the dice are being bonded onto the substrate P, a new substrate P is fed by the substrate feed unit and the new substrate is waiting on the pair of parallel carrying rails.

The control device 7 includes a storage device (memory) that stores programs (software) for monitoring and controlling the operations of the respective units of the flip chip bonder 10 and data, and a central processing unit (CPU) that executes the programs stored in the memory.

Dipping Mechanism

Figure 5:
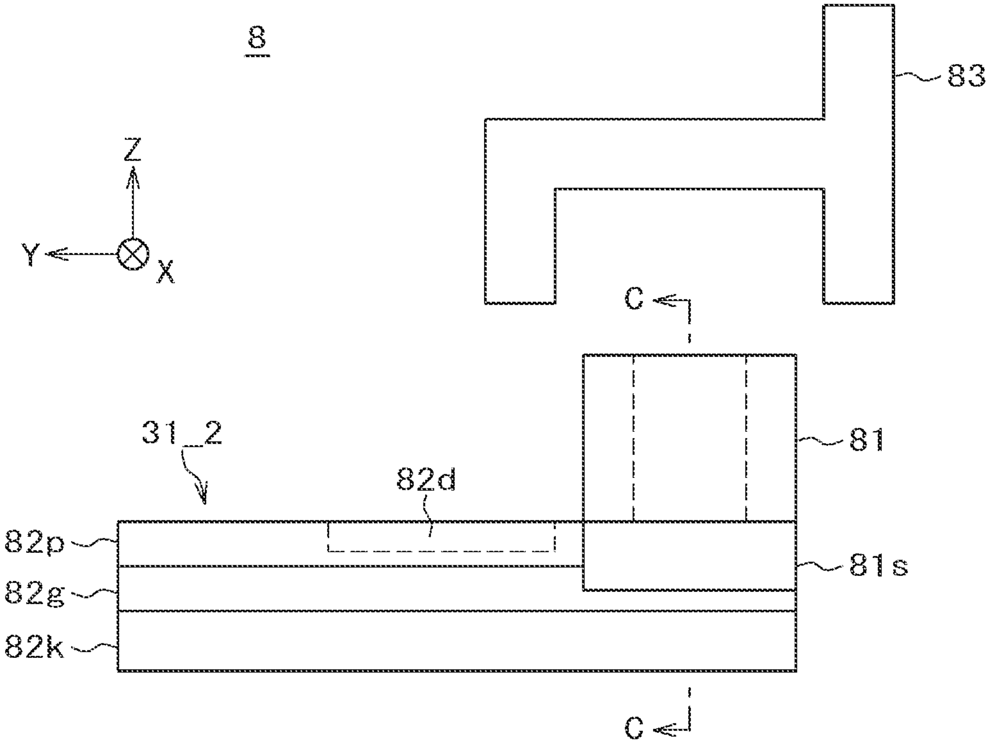
FIG. 5 is a side view of the dipping mechanism of a second intermediate stage shown in FIG. 1 when viewed from a direction perpendicular to the moving direction of the second intermediate stage.
Figure 6:
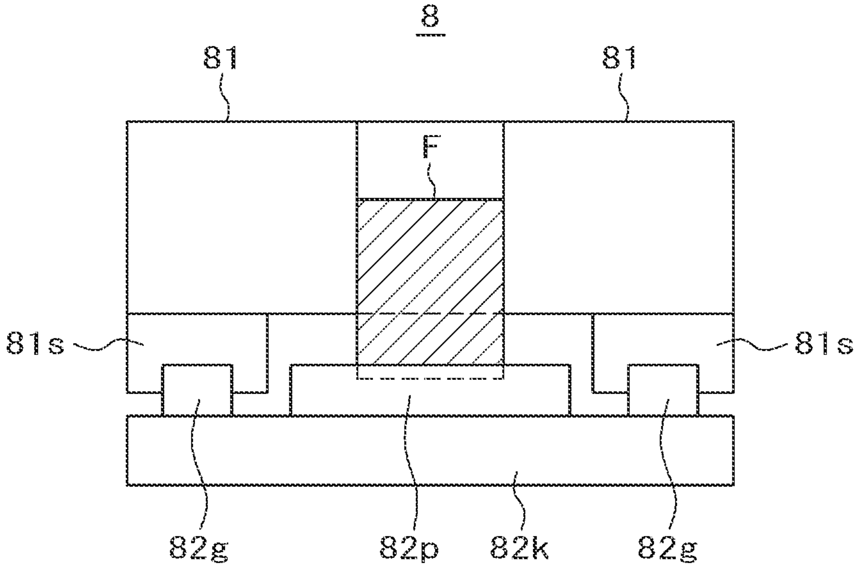
FIG. 6 is a cross-sectional view of the dipping mechanism taken along the line C-C of FIG. 5.

The configuration and operation of the dipping mechanism installed on the second intermediate stage 31_2 will be explained with reference to FIG. 5 and FIG. 6. FIG. 5 is a side view of the dipping mechanism of the second intermediate stage when viewed from a direction perpendicular to the moving direction of the second intermediate stage. FIG. 6 is a cross-sectional view of the dipping mechanism taken along the line C-C of FIG. 5.

Dipping that applies flux to the bumps Db of a die D is performed by immersing the bumps Db of the die D in a concave cavity that contains the flux. This is called flux transfer. Further, some of flux in the concave cavity consumed by the flux application is replenished. This is called flux film forming. A mechanism that performs these flux transfer and flux film forming is called a dipping mechanism or a dipping apparatus.

As shown in FIG. 5, a dipping mechanism 8 includes a squeegee device 81 and a plate 82*p* that embeds a container unit 82*d* that is formed using the concave portion of the plate 82*p* and contains flux F. The plate 82*p* can move along the Y axis direction below the squeegee device 81. As the plate 82*p* moves, the flux F is fed from the squeegee device 81 to the container unit 82*d* to form a homogeneous film. The flux F fed to the container unit 82*d* does not necessarily have to be flux alone, but may be a mixture of flux and a material that is flexible and has an affinity to the flux, for example, a very doughy gelatinous material made mainly of silicone.

The squeegee device 81 is uniformly filled up with the flux F, and the container unit 82*d* is uniformly replenished with the flux F from an opening provided at the bottom of the squeegee device 81. The opening at the bottom of the squeegee device 81 has long sides each of which is equal to or longer than the width of the container unit 82*d* in the X axis direction. A pair of guide sliders 81*s* extending in the Y axis direction is installed below the squeegee device 81.

The container unit 82*d* installed in the plate 82*p* has a concave shape. The transfer head 25 or the bond head 41 descends to the container unit 82*d* and immerses the bumps Db of a die D to transfer flux to the die D. Although FIG. 5 shows that only one container unit 82*d* is installed, plural container units 82*d* may be installed. The depth of the container unit 82*d* is equal to a depth of approximately ½ to ⅔ of the thickness (tb) of a bump Db. For example, if tb=30 μm, the depth of the container unit 82*d* is approximately 15 μm to 20 μm.

The plate 82*p* includes a plate 82*k* below and the plate 82*k* includes a pair of guide rails 82*g* that extends in the Y axis direction on its upper surface. The pair of guide rails 82*g* can move below the pair of guide sliders 81*s*, and the plate 82*p* can move below the squeegee device 81 along the Y axis direction. For example, a flux film can be formed out of flux in the container unit 82*d* by fixing the squeegee device 81 with a squeegee lock 83 and moving the plate 82*p*.

A die D provided with bumps Db is immersed in the container unit 82*d* by the transfer head 25 or bond head 41, so that flux F for soldering is uniformly applied to all the bumps Db. Afterward, the die D to which the flux is transferred on the bumps Db is picked up or pulled up from the container unit 82*d* by the bond head 41.

A flux film forming operation performed by the second intermediate stage 31_2 will be explained below. First, the second intermediate stage 31_2 moves to the flux film forming position, and the squeegee lock 83 descends using an unshown drive unit, and fixes the squeegee device 81.

Next, the second intermediate stage 31_2 moves from left to right in FIG. 5 along the Y axis direction. With this, the pair of guide rails 82*g* installed on the plate 82*k* moves in the Y axis direction below the pair of guide sliders 81*s* installed below the squeegee device 81, and in other words, the squeegee device 81 moves from the right end to the left end of the plate 82*p* along the Y axis direction relative to the plate 82*p*. As a result, the flux F in the squeegee device 81 is fed to the container unit 82*d* of the plate 82*p*. Next, the second intermediate stage 31_2 moves from right to left in FIG. 3 in the Y axis direction, and in other words, the squeegee device 81 moves from the left end to the right end of the plate 82*p* along the Y axis direction relative to the plate 82*p*. As a result, the flux F in the squeegee device 81 is fed to the container unit 82*d* of the plate 82*p*. By this back-and-forth motion of the second intermediate stage 31_2, a flux film is formed out of the flux F in the container unit 82*d* of the plate 82*p*.

Finally, the squeegee lock 83 ascends, and the fixation of the squeegee device 81 is released.

Figure 7:
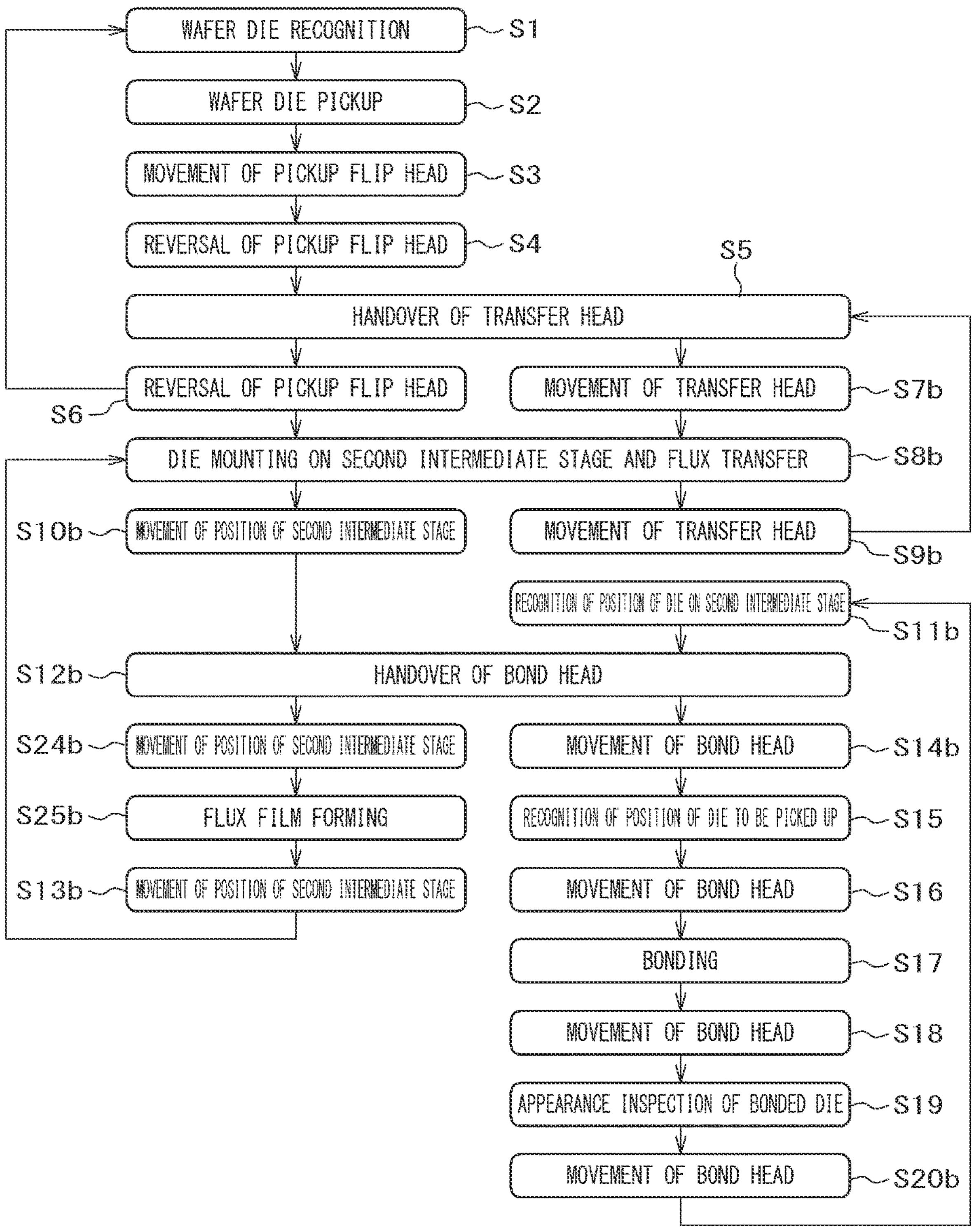
FIG. 7 is a flowchart showing a face-down bonding method performed in the flip-chip bonder shown in FIG. 1.

Next, a manufacturing method of a semiconductor device using the flip chip bonder 10 will be explained with reference to FIG. 1, FIG. 2, FIG. 4, FIG. 5, and FIG. 7. FIG. 7 is a flowchart showing a face-down bonding method performed in the flip-chip bonder shown in FIG. 1.

In the flip-chip bonder 10, plural face-down bonding methods can be performed. In a first face-down bonding method, the second intermediate stage 31_2 is used as a flux transfer stage, and a die is immersed in flux by the transfer head 25 to perform flux transfer. In a second face-down bonding method, the second intermediate stage 31_2 as the flux transfer stage and the first intermediate stage 31_1 are used, and a die is immersed in flux by the bond head 41 to perform flux transfer. In a third face-down bonding method, a die is photographed before and after the flux transfer performed in the second face-down bonding method and transfer misalignment is checked. In the explanation of the following manufacturing method for a semiconductor device, an example using the first face-down bonding method will be explained.

In the die bonding step of a manufacturing method for a semiconductor device according to the present embodiment, first, a wafer ring 14 holding a dicing tape 16, to which dice D obtained by dividing the wafer 11 shown in FIG. 4 is attached, is carried in the flip-chip bonder 10. The control device 7 mounts the wafer ring 14 holding the wafer 11 on the wafer holding pedestal 12 of the die feed unit 1. Furthermore, the control device 7 prepares a substrate P, and carries the substrate P in the flip-chip bonder 10.

Step S1: Wafer Die Recognition

The control device 7 moves the wafer holding pedestal 12 to a reference position where the pickup of a die D is executed using the wafer holding pedestal table 19. Next, the control device 7 photographs a die D to be picked up using the wafer recognition camera 24, and executes a fine adjustment (alignment) using a photographed and obtained image so that the disposition position of the wafer 11 accurately coincides with the reference position. In other words, the control device 7 moves the wafer holding pedestal 12 shown in FIG. 4 using the wafer holding pedestal table 19 so that the die D to be picked up is located just above the push-up unit 13 and positions the die to be peeled off with respect to the push-up unit 13 and the collet 22.

Step S2: Wafer Die Pickup

As shown in FIG. 2, the control device 7 moves the push-up unit 13 upward so that the upper surface of the push-up unit 13 comes into contact with the back surface of the dicing tape 16. At this time, the control device 7 makes the dicing tape 16 adhere to the upper surface of the push-up unit 13. The control device 7 makes the collet 22 descend by vacuuming, and lands the collet 22 on the die D to be peeled off to make the collet 22 adsorb the die D. The control device 7 makes the collet 22 ascend, and the die D is peeled off from the dicing tape 16. With this, the die D is picked up by the pickup flip head 21.

Step S3: Movement of Pickup Flip Head

The control device 7 moves the pickup flip head 21 from the pickup position to a reverse position.

Step S4: Reversal of Pickup Flip Head

As shown in FIG. 2, the control device 7 rotates the pickup flip head 21 by 180 degrees, turns the surface on which the bumps Db of the die D are formed (front surface) downward, and then sets the die D to be in the posture of being handed over to the transfer head 25.

Step S5: Handover of Transfer Head

As shown in FIG. 2, the control device 7 makes the collet 26 descend by vacuuming, and lands the collet 22 on a die D held by the pickup flip head 21 to make the collet 26 adsorb the die D. The adsorption by the pickup flip head 21 using the collet 22 is released, and at the same time, the collet 26 of the transfer head 25 is raised to pick up the die D. As a result, the die D is handed over to the transfer head 25.

Step S6: Reversal of Pickup Flip Head

As shown in FIG. 2, the control device 7 rotates the pickup flip head 21 to turn the adsorption surface of the collet 22 downward.

Step S7*b*: Movement of Transfer Head

As shown in FIG. 1, the control device 7 moves the transfer head 25 along the X axis direction using the drive unit 27 from a zeroth position P0, which is a position for handing over the die D to the pickup flip head 21, to above the second intermediate stage 31_2 before or in parallel with Step S6. In this case, the second intermediate stage 31_2 is located at a first position P1 in the Y axis direction.

Step S8*b*: Die Mounting on Second Intermediate Stage and Flux Transfer

As shown in FIG. 1, the control device 7 makes the transfer head 25 descend and puts the die D, which is held by the transfer head 25, in the container unit 82*d* installed on the second intermediate stage 31_2. With this, the bumps Db of the die D are immersed in a flux film formed out of the flux F in the container unit 82*d*, and the formed flux film is transferred to the bumps of the die D.

Step S9*b*: Movement of Transfer Head

As shown in FIG. 1, the control device 7 makes the transfer head 25 ascend and moves the transfer head 25 along the X axis direction to the zeroth position P0. While maintaining this state, the bond head 41 is moved to the third position P3 using the X beam and the gantry table 43. The second intermediate stage 31_2 is waiting at the third position P3.

Step S10*b*: Movement of Position of Second Intermediate Stage

As shown in FIG. 1, the control device 7 moves the second intermediate stage 31_2 along the Y axis direction from the first position P1 to the third position P3 after or in parallel with Step S9*b*. At this time, the bumps Db of the die D are being immersed in the flux film in the container unit 82*d*.

Step S11*b*: Recognition of Position of Die on Second Intermediate Stage

As shown in FIG. 1 and FIG. 3, after Step S10*b* before moving the bond head 41 to the third position P3, the control device 7 takes image of the die D mounted on the second intermediate stage 31_2 by the bond camera 44 to recognizes the position of the die D. The control device 7 may correct the position of the die D using the bond head 41 on the basis of the recognition result.

Step S12*b*: Handover of Bond Head

As shown in FIG. 1, the control device 7 makes the bond head 41 descend using the bond head table 45, and makes the collet of the bond head 41 adsorb the die to the bumps Dp of which the flux F is transferred. Then the control device 7 makes the bond head 41 ascend using the bond head table 45, and picks up the die D from the second intermediate stage 31_2. With this, the handover of the die D is executed. While maintaining this state, the control device 7 picks up the die D from the pickup flip head 21 using the transfer head 25.

Step S24*b*: Movement of Position of Second Intermediate Stage

As shown in FIG. 1, the control device 7 moves the second intermediate stage 31_2 along the Y axis direction from the third position P3 to the second position P2 after or in parallel with Step S14*b*. Although the second intermediate stage 31_2 is located at the second position P2 in this case, it is conceivable that the second intermediate stage 31_2 is located between the third position P3 and the first position P1, or located at the third position P3 without moving.

Step S25*b*: Flux Film Forming

As shown in FIG. 1 and FIG. 5, the control device 7 makes the squeegee lock 83 descend to fix the squeegee device 81, and at the same time, the control device 7 further moves the second intermediate stage 31_2 (plate 82) along the Y axis direction from the second position P2 to a side opposite to the first position P1. As a result, the flux F is fed from the squeegee device 81 to the container unit 82*d* of the plate 82*p*, so that a flux film is formed. Then the control device 7 measures the thickness of the formed flux film using a film thickness measurement device 91 such as a laser displacement meter. While maintaining this state, the control device 7 moves the bond head 41 from the third position P3 to above the substrate P using the X beam and the gantry table 43. In addition, the control device 7 moves the transfer head 25 to the first position P1 by the drive unit 27.

Step S13*b*: Movement of Position of Second Intermediate Stage

As shown in FIG. 1, the control device 7 moves the second intermediate stage 31_2 along the Y axis direction from the second position P2 to the first position P1.

Step S14*b*: Movement of Bond Head

As shown in FIG. 1, the control device 7 makes the bond head 41 ascend or descend using the bond head table 45, and moves the die D held by the collet 42 of the bond head 41 using the X beam and the gantry table 43 from the second intermediate stage 31_2 to above the under vision camera 34 in parallel with Step S24*b*.

Step S15: Recognition of Position of Die to Be Picked Up

As shown in FIG. 1, the control device 7 photographs the die D held by the collet 42 of the bond head 41 using the under vision camera 34, and recognizes the position of the die D.

Step S16: Movement of Bond Head

As shown in FIG. 1, the control device 7 moves the die D held by the collet 42 of the bond head 41 using the X beam and the gantry table 43 from above the under vision camera 34 to above the substrate P. In this state, the second intermediate stage 31_2 is performing the flux film forming operation (Step S25*b*). Furthermore, the transfer head 25 picks up the next die D fed from the pickup flip head 21 and moves to the first position P1. The first intermediate stage 31_1 is waiting at the third position P3.

Step S17: Bonding

As shown in FIG. 1, the control device 7 makes the bond head 41 descend using the bond head table 45, and bonds the die D held by the collet 42 of the bond head 41 onto the substrate P. In this state, the flux film forming has already been finished on the second intermediate stage 31_2. In addition, the transfer head 25 is waiting at the first position P1 while holding the next die D. The first intermediate stage 31_1 is waiting at the third position P3.

(Step S18: Movement of Bond Head)

After making the bond head 41 ascend or descend using the bond head table 45, the control device 7 moves the bond head 41 (bond camera 44) to an appearance inspection position above the substrate P using the X beam and the gantry table 43.

(Step S19: Appearance Inspection of Already-Bonded Die)

The control device 7 photographs the die D already bonded on the substrate P using the bond camera 44 to inspect the appearance of the die.

Step S20*b*: Movement of Bond Head

As shown in FIG. 1, the control device 7 makes the bond head 41 ascend or descend using the bond head table 45, and moves the bond head 41 using the X beam and the gantry table 43 from the appearance inspection position above the substrate P to above the second intermediate stage 31_2 located at the third position P3. In this state, the flux film forming has already been finished on the second intermediate stage 31_2. Furthermore, the transfer head 25 has moved from the first position P1 to the zeroth position P0 to pick up the next die D.

In addition, if all dice D on the substrate P have already been bonded, the control device 7 brings out the substrate P on which all the dice D have been already bonded from the pair of parallel carrying rails at the substrate carrying-out unit after Step S19, and carries out the substrate P from the flip chip bonder 10.

Afterward, by sealing the plural dice (semiconductor chips) disposed on the substrate P in a lot with sealing resin, a sealed body including the plural semiconductor chips and a sealing resin that covers the plural semiconductor chips is formed. Successively, the substrate P is peeled off from the sealed body, and then a rewiring layer is formed on the surface to which the substrate P of the sealed body is attached to manufacture an FOPLP.

In the first face-down bonding method according to the present embodiment, as shown in FIG. 1, a die D is immersed in flux film in the container unit 82*d* of the second intermediate stage 31_2 by the transfer head 25. Here, the second intermediate stage 31_2 can move along the Y axis direction between the first position P1, which is a position for handing over a die D to the transfer head 25, and the third position P3, which is a position for handing over a die D to the bond head 41. Furthermore, flux film forming is performed when the second intermediate stage 31_2 is at the second position P2. Here, the flux film forming position does not necessarily have to be the second position P2, and for example, the flux film forming position may be the first position P1 or the third position P3.

In the first face-down bonding method according to the present embodiment, the flux transfer function is prepared so that a die D is directly mounted on the second intermediate stage 31_2 by the transfer head 25. Hereby, flux transfer can be performed during a series of pickup operations in which a die D is handed over from the transfer head 25 to the bond head 41.

Figure 8:
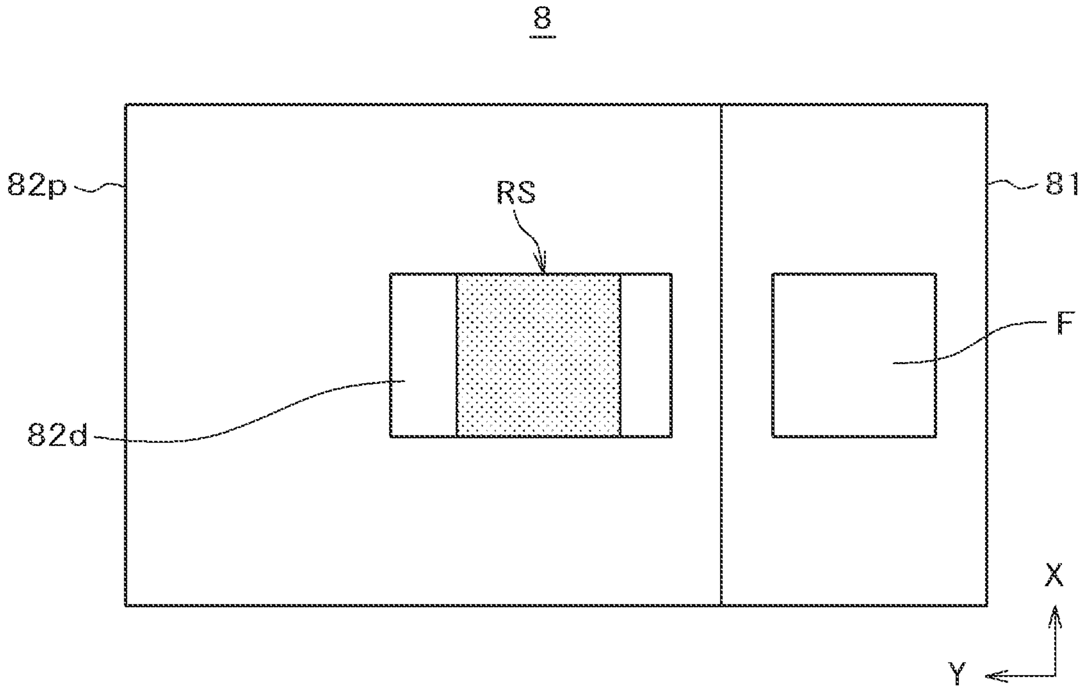
FIG. 8 is a top view showing the main portion of the dipping mechanism shown in FIG. 5.

Successively, the plate 82*p* of the dipping mechanism 8 according to the present embodiment will be explained with reference to FIG. 8. FIG. 8 is a top view showing the main portion of the dipping mechanism shown in FIG. 5.

Stable rough surface RS is formed on at least on a portion (film forming surface) of the upper surface (front surface) of the bottom of the container unit 82*d* installed in the plate 82*p* as a transfer plate, where the bumps Db are immersed. The surface roughnesses (arithmetically average roughness (Ra)) of the rough surface RS is nano-level. Nano-level means a length between 1 nm or more and less than 1000 nm. Ra is preferably 100 to 1000 nm. For example, it is conceivable that concavities and convexities Ra of which is 300 to 500 nm are formed on the surface of the container unit 82*d* by performing NAP processing (registered trademark). Here, the material of the plate 82*p* is, for example, SUS (stainless steel).

Figure 9A:
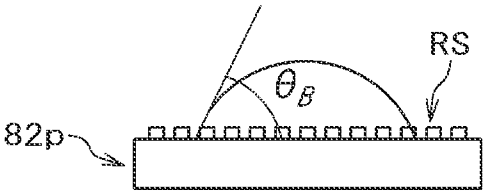
FIG. 9A is a diagram showing a contact angle when rough surface processing is performed on the plate of the dipping mechanism.
Figure 9B:
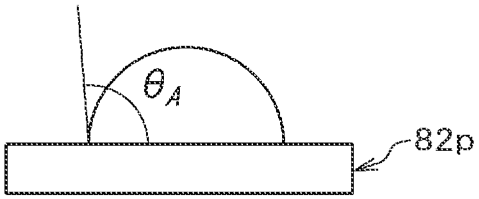
FIG. 9B is a diagram showing a contact angle when the rough surface processing is not performed on the plate of the dipping mechanism.

Successively, the wettability of the rough surface formed on the surface of the container unit 82*d* of the plate 82*p* (the film forming surface of the plate 82*p*) to the flux film will be explained with reference to FIG. 9A and FIG. 9B. FIG. 9A is a diagram showing a contact angle when rough surface processing is performed on the plate, and FIG. 9B is a diagram showing a contact angle when the rough surface processing is not performed on the plate.

As shown in FIG. 9A, in the case where a rough surface RS is formed on the film forming surface of the plate 82*p*, a contact angle (00 becomes smaller than 90 degrees due to the reduction of surface tension (a capillary phenomenon) caused by the rough surface RS, so that the wettability of the film forming surface to the flux film is improved. Here, as shown in FIG. 9B, in the case where the rough surface is not formed on the film forming surface of the plate 82*p*, a contact angle ($\theta_A$) becomes larger than 90 degrees. Meanwhile, since a rough surface with nano-level roughnesses has roughnesses smaller than a rough surface with micro-level roughnesses or larger, the influence of the concavities and convexities of the former rough surface on the thin film of the flux can be made smaller. The micro-level roughnesses or larger are 1 μm roughnesses or larger.

Figure 10:
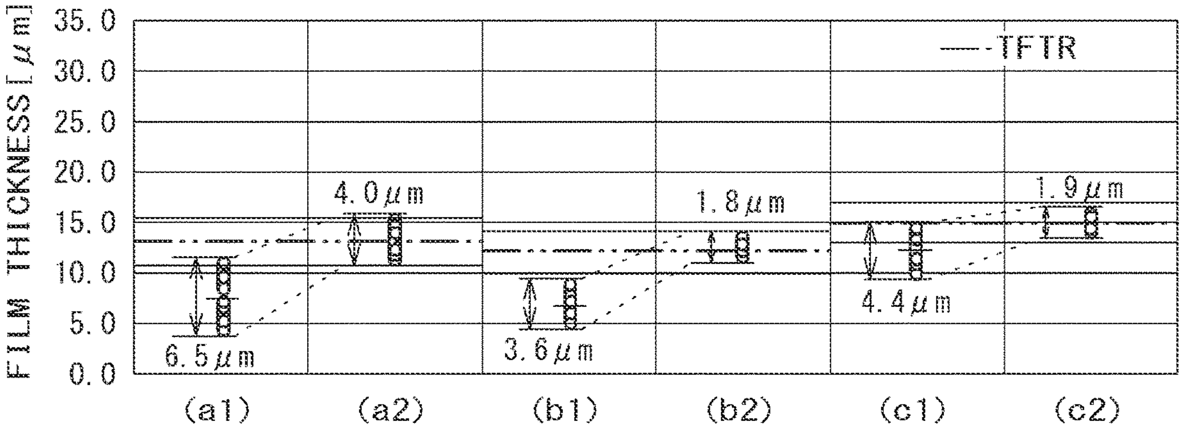
FIG. 10 is a diagram showing variations in the thicknesses of flux films in accordance with the presence or absence of the rough surfaces of the surfaces of plates and the viscosities of fluxes in the case of a gap height being 20 μm.
Figure 11:
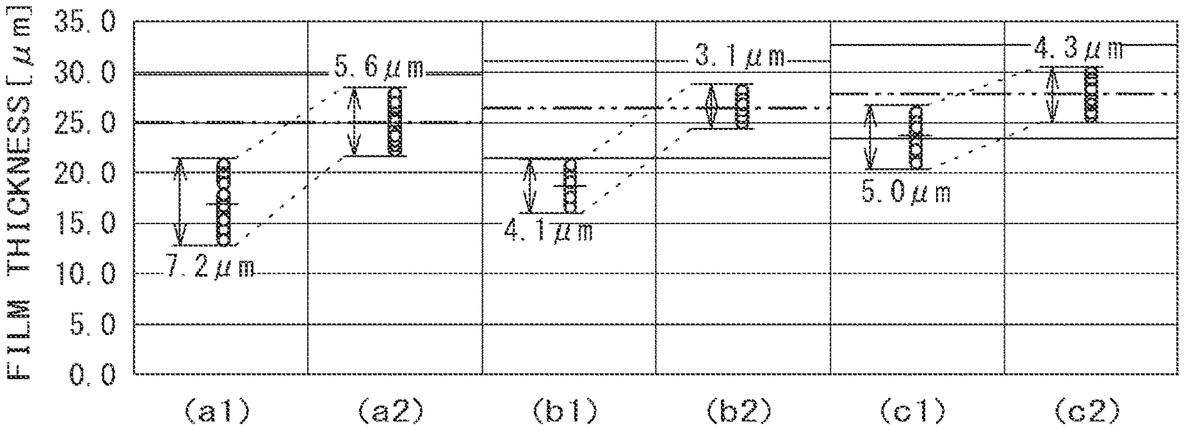
FIG. 11 is a diagram showing variations in the thicknesses of flux films in accordance with the presence or absence of the rough surfaces of the surfaces of plates and the viscosities of fluxes in the case of a gap height being 40 μm.

Variations in the thicknesses of flux films formed on the film forming surface of the plate 82*p* will be explained with reference to FIG. 10 and FIG. 11. FIG. 10 is a diagram showing variations in the thicknesses of formed flux films in accordance with the presence or absence of the roughnesses of the surface of the plate and the viscosities of the fluxes in the case of a gap height being 20 μm. FIG. 11 is a diagram showing variations in the thicknesses of the formed flux films in accordance with the presence or absence of the roughnesses of the surface of the plate and the viscosities of the fluxes in the case of a gap height being 40 μm. Here, the gap height is also called a squeegee height, that is, a height from the surface of the container unit 82*d* to the bottom surface of the squeegee device 81.

Variations in the thicknesses of the flux films in the case where there are no roughnesses on the film forming surfaces of the plate 82*s* and the viscosity of the flux is 10 Pa·s are shown in (a1) in FIG. 10 and (a1) in FIG. 11. Variations in the thicknesses of the flux films in the case where there are roughnesses on the film forming surfaces of the plate 82*s* and the viscosity of the flux is 10 Pas are shown in (a2) in FIGS. 10 and (a2) in FIG. 11. Each of targeted film thickness range (TFTR) in (a1) in FIG. 10 and that in (a2) in FIG. 10 is 13 μm±2 μm. Each of targeted film thickness range (TFTR) in (a1) in FIG. 11 and that in (a2) in FIG. 11 is 25 μm±2 μm.

Variations in the thicknesses of the flux films in the case where there are no roughnesses on the film forming surfaces of the plate 82*s* and the viscosity of the flux is 25 Pas are shown in (b1) in FIG. 10 and (b1) in FIG. 11. Variations in the thicknesses of the flux films in the case where there are roughnesses on the film forming surfaces of the plate 82*s* and the viscosity of the flux is 25 Pas are shown in (b2) in FIGS. 10 and (b2) in FIG. 11. Each of targeted film thickness range (TFTR) in (b1) in FIG. 10 and that in (b2) in FIG. 10 is 12 μm±2 μm. Each of targeted film thickness range (TFTR) in (b1) in FIG. 11 and that in (b2) in FIG. 11 is 26 μm±5 μm.

Variations in the thicknesses of the flux films in the case where there are no roughnesses on the film forming surfaces of the plate 82*s* and the viscosity of the flux is 33 Pa·s are shown in (c1) in FIGS. 10 and (c1) in FIG. 11. Variations in the thicknesses of the flux films in the case where there are roughnesses on the film forming surfaces of the plate 82*s* and the viscosity of the flux is 33 Pas are shown in (c2) in FIGS. 10 and (c2) in FIG. 11. Each of targeted film thickness range (TFTR) in (c1) in FIG. 10 and that in (c2) in FIG. 10 is 15 μm±2 μm. Each of targeted film thickness range (TFTR) in (c1) in FIG. 11 and that in (c2) in FIG. 11 is 27 μm±5 μm.

As shown in FIG. 10 and FIG. 11, even in any of the above combinations of the flux viscosities and the gap heights, if there is no rough surface on the film forming surface of the plate 82*p*, measured values become smaller than the relevant targeted film thickness range (the range of the relevant set values). In addition, a variation in the measured values is larger than the range of the relevant set values. In any of the above combinations of the flux viscosities and the gap heights, if there is a rough surface on the film forming surface of the plate 82*p*, most of measured values fall within the relevant targeted film thickness range. Furthermore, any of variations in film thicknesses is smaller than the relevant variation in the case of there being no rough surface.

It is presumed that the flux is pulled by the surface tension or pulled by the squeegee device due to the inner surface of the outer periphery of the film forming surface, so that the thickness of the flux film near the center of the film forming surface tends to become small to deviate from the range of the relevant set values. On the contrary, if the film forming surface is roughened, it is presumed that a surface resistance that opposes the surface tension and the like is generated at an interface between the roughened surface and the flux, so that the flux is prevented from flowing and the tendency for the thickness of the flux film to become thinner is weakened.

Figure 12:
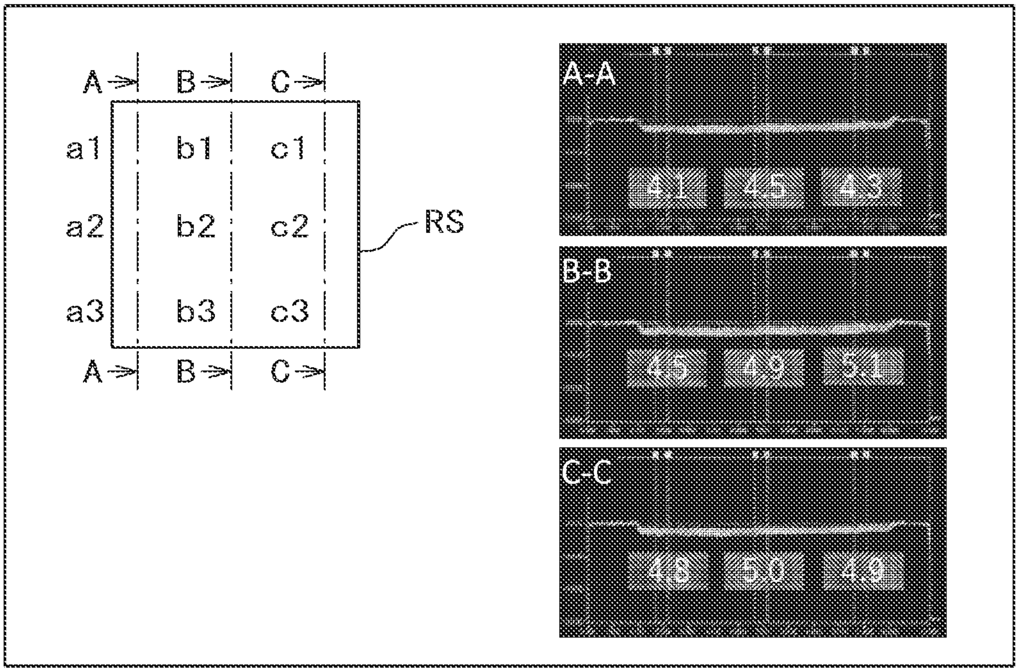
FIG. 12 is a diagram showing variations in the thickness of a flux film in the case of the viscosity of flux being 10 Pas.
Figure 13:
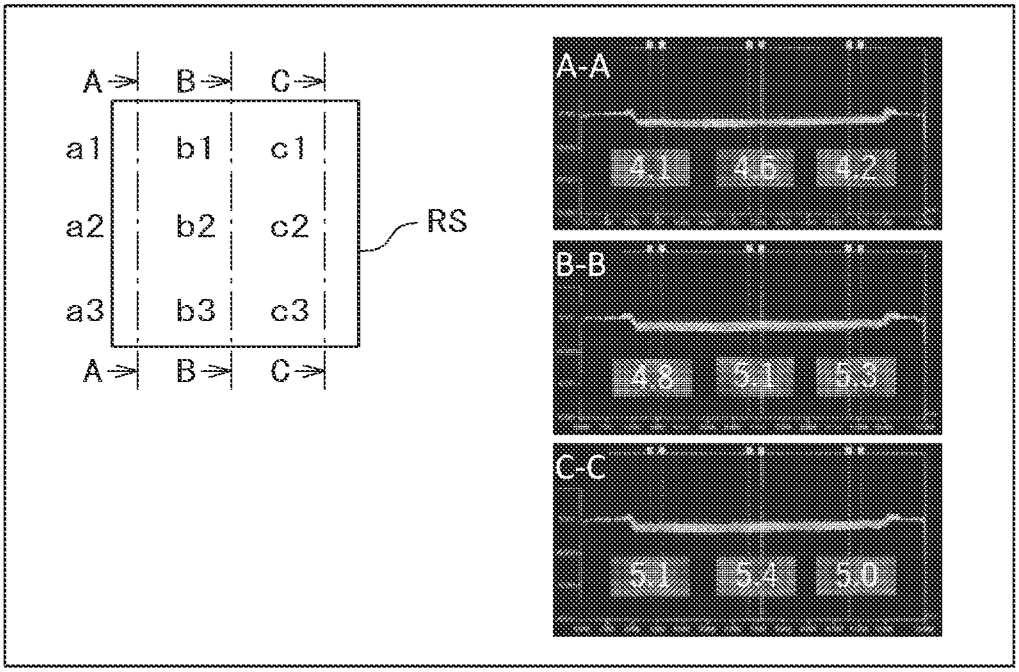
FIG. 13 is a diagram showing variations in the thickness of a flux film in the case of the viscosity of flux being 33 Pas.

Variations in film thicknesses in the case where a targeted film thickness range is 5 μm±20% will be explained with reference to FIG. 12 and FIG. 13. FIG. 12 is a diagram showing a variation in the thickness of a flux film in the case of the viscosity of the flux being 10 Pa·s. FIG. 13 is a diagram showing a variation in the thickness of a flux film in the case of the viscosity of the flux being 33 Pa·s.

As shown in FIG. 12, a film thickness in a1 is 4.1 μm, a film thickness in a2 is 4.5 μm, and a film thickness in a3 is 4.3 μm. In addition, a film thickness in b1 is 4.5 μm, a film thickness in b2 is 4.9 μm, and a film thickness in b3 is 5.1 μm. A film thickness in c1 is 4.8 μm, a film thickness in c2 is 5.0 μm, and a film thickness in c3 is 4.9 μm. The film thicknesses in the nine portions (a1, a2, a3, b1, b2, b3, c1, c2, and c3) are within 4.1 to 5.1 μm, so that these film thicknesses fall within 5 μm±20%.

As shown in FIG. 13, a film thickness in a1 is 4.1 μm, a film thickness in a2 is 4.6 μm, and a film thickness in a3 is 4.2 μm. In addition, a film thickness in b1 is 4.8 μm, a film thickness in b2 is 5.1 μm, and a film thickness in b3 is 5.3 μm. A film thickness in c1 is 5.1 μm, a film thickness in c2 is 5.4 μm, and a film thickness in c3 is 5.0 μm. The film thicknesses in the nine portions (a1, a2, a3, b1, b2, b3, c1, c2, and c3) are within 4.1 to 5.4 μm, so that these film thicknesses fall within 5 μm±20%.

Figure 14:
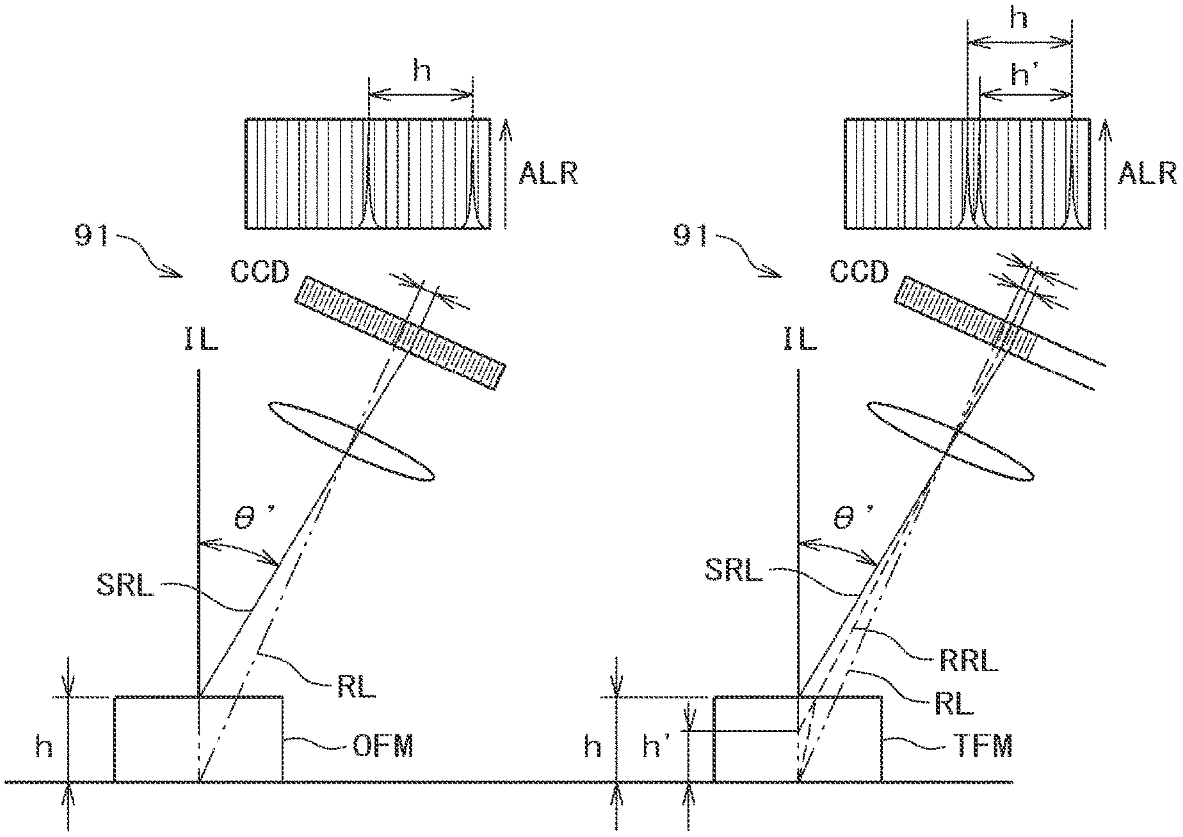
FIG. 14 is a diagram used for explaining the measurement of a film thickness using a laser displacement meter.
Figure 15:
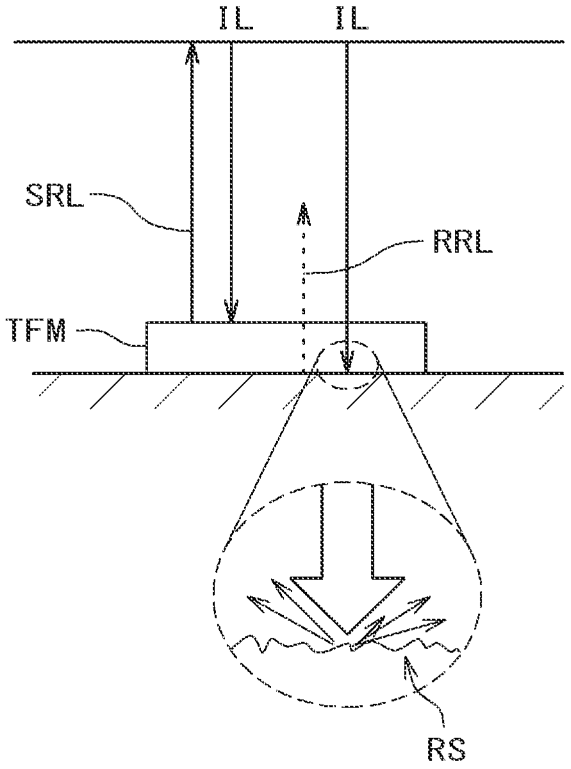
FIG. 15 is a diagram used for explaining that a problem shown in FIG. 14 is solved in the present embodiment.

The thickness of a flux film is measured using the film thickness measurement device 91 every time the flux film is formed. The measurement of the thickness of a flux film will be explained with reference to FIG. 14 and FIG. 15. FIG. 14 is a diagram used for explaining the measurement of a film thickness using a laser displacement meter. FIG. 15 is a diagram used for explaining that a problem shown in FIG. 14 is solved in the present embodiment.

As shown in FIG. 14, the laser displacement meter, which is an example of the film thickness measuring device 91, irradiates a film OFM as an object to be measured with an incident light (IL) of a laser beam, and a reflected light is measured by a sensor such as a CCD (Charge Coupled Device), and the thickness of the film OFM is measured on the basis of a distance (h) between the peaks of the received light amount (ALR) of the reflected light.

As shown in a left drawing in FIG. 14, if a film to be formed is opaque, the thickness (h) of the film OFM is measured using a reflected light (RL) obtained by the incident light (IL) reflected on the surface of an object and a surface reflected light (SRL) obtained by the incident light (IL) reflected on the surface of the formed opaque film OFM.

On the other hand, as shown in a right drawing in FIG. 14, if a film to be formed is transparent, the laser displacement meter receives a refracted and reflected light (RRL), which is a light obtained by an incident light (IL) reflected at the bottom surface of a formed transparent film TFM and refracted, so that it is difficult to separate a surface reflected light (SRL) from the refracted and reflected light (RRL). Therefore, there is a possibility that an erroneous measurement for measuring a film thickness (h') on the basis of the refracted and reflected light (RRL) is executed.

An incident light is specularly reflected (easily reflected) on the surface of a metal such as SUS (stainless steel). On the other hand, as shown in FIG. 15, if rough surface processing is performed on the surface of a metal, an incident light is diffusedly reflected (not easily reflected) on the roughened surface. Therefore, the received light amount of a refracted and reflected light (RRL) becomes smaller than the received light amount of a surface reflected light (SRL) that is reflected at the surface of a transparent film TFM, so that it becomes easier to separate the surface reflected light (SRL) from the refracted and reflected light (RRL).

According to the present embodiment, low-viscosity flux with low wettability is prevented from agglutinating, and even a thin film the thickness of which is 5 μm or less and uniform can be formed. With this, flux can be transferred to bumps the diameters of which are ϕ 10 to 30 μm.

Furthermore, according to the present embodiment, a material having a small affinity to flux such as SUS can be used to form a transfer plate for a thin film. In addition, it becomes easier to remove old flux from a transfer plate than from a rough surface with a micro-level roughnesses or larger. Furthermore, a thin flux film can be stably spread by using the squeegee mechanism. In addition, it becomes easier to measure the thickness of a film. Furthermore, it becomes possible to stably manufacture semiconductor products with narrow bump pitches.

Modification Examples

Hereinafter, several typical modification examples of the present embodiment will be illustrated. In the explanations of the following modification examples, it will be assumed that components that have the same configurations and functions as those of components described in the above embodiment can be given the same reference signs as those given to the components described in the above embodiment. And it will be assumed that, in descriptions about such components, the descriptions about the corresponding components of the above-described embodiment can be quoted accordingly as long as there are no technical contradictions. In addition, part of the above-described embodiment and the entireties or parts of the plural modification examples can be adapted to one another accordingly and intricately as long as there are no technical contradictions.

First Modification Example

Figure 16:
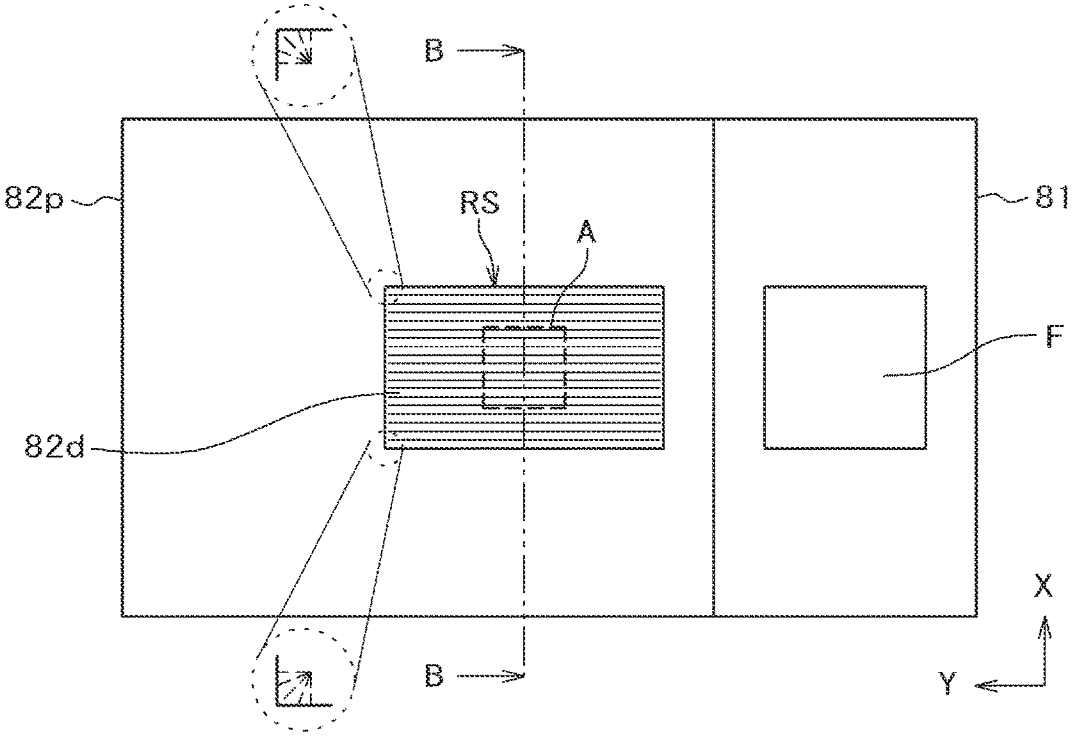
FIG. 16 is a top view showing the main portion of a dipping mechanism according to a first modification example.
Figure 17A:
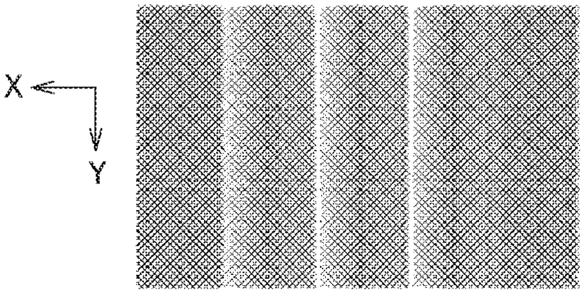
FIG. 17A is a top view of the inside of a broken line A shown in FIG. 16.
Figure 17B:
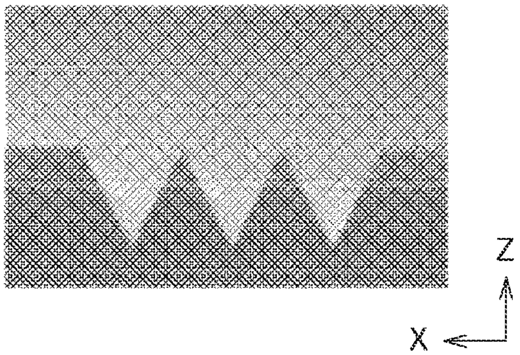
FIG. 17B is a cross-sectional view of the main portion of the dipping mechanism taken along the line B-B of FIG. 16.

A plate 82*p* of a dipping mechanism 8 according to a first modification example will be explained with reference to FIG. 16, FIG. 17A, and FUG. 17B. FIG. 16 is a top view showing the main portion of the dipping mechanism according to the first modification example. FIG. 17A is a top view of the inside of a broken line A shown in FIG. 16, and FIG. 17B is a cross-sectional view of the main portion of the dipping mechanism taken along the line B-B of FIG. 16.

As shown in FIG. 16, stable rough surface RS, which gives nano-level surface roughnesses (arithmetically average roughness (Ra)), is formed on at least to a portion, in which bumps Db are immersed, on the bottom surface of a container unit 82*d* installed on the plate 82*p* that is a transfer plate. For example, as shown in FIG. 17A and FIG. 17B, the rough surface RS is formed in such a way that, in the squeegee operation of the dipping mechanism 8, nano-level continuous grooves are formed along the moving direction of the plate 82*p* (the Y axis direction) using, for example, a shaper method. It is more preferable that the rough surface RS includes continuous grooves the directions of which are formed along a direction in which flux spreads. In other words, as shown in FIG. 16, the continuous grooves are formed on the rough surface RS at either one of two corners located on the side of the container unit 82*d* far from the squeegee device 81. The each of continuous grooves is formed along a direction having a component in the X axis direction in addition to a component in the Y axis direction. Several continuous grooves each of which may be formed along only the Y axis direction at either one of two corners located on the side of the container unit 82*d* near to the squeegee device 81, or several continuous grooves each of which may be formed along a direction having a component in the X axis direction in addition to a component in the Y axis direction at either one of the two corners. The grooves formed on the surface of the bottom of the container unit 82*d* have, for example, Ra of 300 to 500 nm. Here, the material of the plate 82*p* is, for example, SUS.

According to the first modification example, surface tension is reduced (a capillary phenomenon occurs) by the squeegee operation and the grooves formed along one direction and in parallel with one another, and on top of that, the mobility of a liquid in the grooves is also enhanced due to the squeegee operation. With this, the extensibility of the flux is improved by the squeegee operation, and the formation of a thin film can be performed more stably. Furthermore, in the case where flux is continuously applied to the transfer plate (dipping plate), the squeegee operation makes it possible to efficiently discharge flux including deteriorated flux applied to the tips of the grooves, so that product defects due to foreign materials caused by the deteriorated flux can be reduced.

Second Modification Example

Figure 18A:
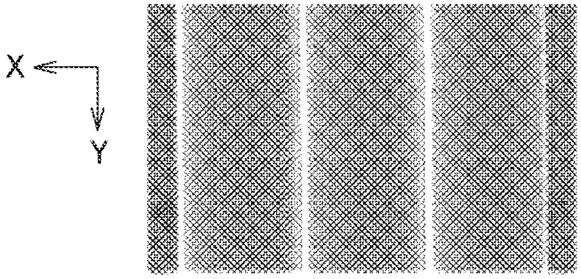
FIG. 18A is a top view of a portion corresponding to the inside of the broken line A shown in FIG. 16 in a second modification example.
Figure 18B:
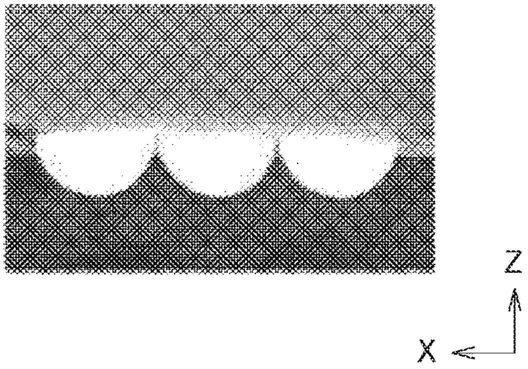
FIG. 18B is a cross-sectional view of a portion corresponding to the main portion of the dipping mechanism taken along the line B-B of FIG. 16 in the second modification example.

A plate 82*p* of a dipping mechanism 8 according to a second modification example will be explained with reference to FIG. 18A and FIG. 18B. FIG. 18A is a top view of a portion corresponding to the inside of the broken line A shown in FIG. 16, and FIG. 18B is a cross-sectional view of a portion corresponding to the main portion of the dipping mechanism taken along the line B-B of FIG. 16.

A rough surface RS may be formed in such a way that, in the squeegee operation of the dipping mechanism 8, nano-level continuous polished grooves are formed along the moving direction of the plate 82*p* (the Y axis direction). The grooves formed on the surface of the bottom of a container unit 82*d* have, for example, Ra of 300 to 500 nm. Here, the material of the plate 82*p* is, for example, SUS.

Although the disclosure made by the present disclosers has been concretely described so far on the basis of the embodiment and modification examples, it goes without saying that the present disclosure is not limited to the above embodiment and modification examples, and can be variously modified.

For example, in the present embodiment, an illustrative example in which a flux film is formed by moving the plate 82*p* while a squeegee device 81 is fixed has been explained. However, it is all right if the squeegee device 81 moves relative to the plate 82*p*, so that the plate 82*p* may be fixed and the squeegee device 81 may be moved to form a flux film out of flux.

In addition, in the modification examples, illustrative examples in which grooves are provided in one direction parallel with the squeegee movement have been explained. However, it is all right as long as a direction in which the grooves are extended has a component parallel with the squeegee movement, so that, for example, the grooves may be extended along a direction having any angle other than 90 degrees, preferably 45 degrees or less, more preferably an angle close to 0 degrees with respect to the direction of the squeegee movement. It is also conceivable that the grooves are extended in zig zag shapes.

Furthermore, it is conceivable that a transfer plate is formed in a circular shape, and the squeegee device is rotated. In this case, concentric vertical grooves are formed on the transfer plate to form a flux thin film. It is also conceivable that the transfer plate is rotated while the squeegee device is fixed.

In addition, it is conceivable that a squeegee height is set to be variable. With this, when a thin flux film is formed, it is possible to adjust the height of the squeegee device on the basis of the measured thickness of the flux film, so that appropriate flux film forming processing can always be performed. When deteriorated flux is discharged, the squeegee height has to be narrowed. This makes it possible to further increase the property of discharging flux in the nano-level rough surface (including the grooves) of the transfer plate.

Furthermore, it is desirable that the transfer plate can be easily detached. This facilitates the cleaning of the transfer plate. In addition, when the transfer plate is detached and cleaned, because the depth of holes of the rough surface with nano-level roughnesses is shallow, so that the cleanability of the transfer plate is enhanced.

Furthermore, when the transfer plate is cleaned, it is also conceivable to execute a squeegee operation while discharging the cleaning alcohol which is the solvent of the flux from the squeegee device. As a result, the cleaning liquid can be made to physically go around the shallow nano-level rough surface, and the cleaning efficiency can be further improved.

In addition, it is also conceivable that an ultrasonic wave is applied to the transfer plate when a flux thin film is formed. However, the ultrasonic wave is not applied when a transfer operation is performed. In this case, the squeegee operation can smooth the portions to which the flux is partially thickly applied, so that the free energy of the surface of the transfer plate is increased and the wettability of the surface of the transfer plate is enhanced.

Furthermore, it is also conceivable that nano-level continuous grooves are arranged along a direction in which flux is guided to positions where the flux is difficult to spread due to the structure of the transfer plate. This makes it possible to perform flux film forming that guides flux to the positions where the flux is difficult to spread while enhancing the wettability as a whole.

In addition, although, in the present invention, the explanations have been made taking a flip chip bonder used for manufacturing an FOPLP as an example, these explanations can also be applied to a fan out wafer level package (FOWLP).

What is claimed is:

1. A manufacturing method for a semiconductor device comprising:

a flux film forming step of supplying flux to a plate having a rough surface with a nano-level arithmetically average roughness on the rough surface that provides wettability of the rough surface to the flux, thereby forming a thin film of the flux on the plate; and a flux transferring step of transferring the thin film of the flux to bumps of a die by immersing the bumps in the thin film of the flux, wherein in the flux film forming step, a squeegee device provided in the semiconductor device is fixed and the plate is moved, and the flux is supplied from the squeegee device to the rough surface of the plate.

2. A manufacturing method for a semiconductor device comprising:

a flux film forming step of supplying flux to a plate having a rough surface with a nano-level arithmetically average roughness on the rough surface that provides wettability of the rough surface to the flux, thereby forming a thin film of the flux on the plate; and a flux transferring step of transferring the thin film of the flux to bumps of a die by immersing the bumps in the thin film of the flux, wherein the rough surface includes continuous grooves the directions of which have components along a direction in which the plate moves.

3. A manufacturing method for a semiconductor device comprising:

a flux film forming step of supplying flux to a plate having a rough surface with a nano-level arithmetically average roughness on the rough surface that provides wettability of the rough surface to the flux, thereby forming a thin film of the flux on the plate;

a flux transferring step of transferring the thin film of the flux to bumps of a die by immersing the bumps in the thin film of the flux; and a bonding step of picking up the die having the bumps to which the thin film of the flux has been transferred from the plate and bonding the die to a substrate, wherein the flux film forming step is performed in parallel with the bonding step.

* * * * *